United States Patent [19]

Davis et al.

[11] Patent Number: 4,866,005
[45] Date of Patent: Sep. 12, 1989

[54] SUBLIMATION OF SILICON CARBIDE TO PRODUCE LARGE, DEVICE QUALITY SINGLE CRYSTALS OF SILICON CARBIDE

[75] Inventors: Robert F. Davis; Calvin H. Carter, Jr., both of Raleigh; Charles E. Hunter, Durham, all of N.C.

[73] Assignee: North Carolina State University, Raleigh, N.C.

[21] Appl. No.: 113,565

[22] Filed: Oct. 26, 1987

[51] Int. Cl.$^4$ .................... H01L 21/205; H01L 21/36
[52] U.S. Cl. ........................... 437/100; 148/DIG. 21; 148/DIG. 148; 156/610; 156/DIG. 64; 437/9; 437/112; 437/949; 437/976
[58] Field of Search .................. 148/DIG. 21, 22, 97, 148/148; 118/612, 722; 156/610, 615, DIG. 91, DIG. 64, DIG. 68; 422/247; 437/9, 100, 88, 103, 112, 970, 949, 976

[56] References Cited

U.S. PATENT DOCUMENTS

| | | | |
|---|---|---|---|
| 2,854,364 | 9/1958 | Lely | 437/85 |
| 3,228,756 | 1/1966 | Hergenrother | 156/612 |
| 3,236,780 | 2/1966 | Ozarow | 252/301.4 R |
| 3,511,614 | 5/1970 | Wenckus et al. | 422/247 |
| 3,558,284 | 1/1971 | Wallis | 422/247 |
| 3,615,930 | 10/1971 | Knippenber et al. | 437/100 |
| 3,910,767 | 10/1975 | Jemal | 422/199 |
| 3,917,459 | 11/1975 | Falckenberg et al. | 422/247 |
| 3,960,503 | 6/1976 | Rice | 422/247 |
| 3,962,406 | 6/1976 | Knippenberg et al. | 423/345 |
| 4,108,670 | 8/1978 | Steiger et al. | 423/297 |
| 4,147,572 | 4/1979 | Vodakov et al. | 437/89 |
| 4,310,614 | 1/1982 | Conwell et al. | 118/730 |
| 4,556,436 | 12/1985 | Addamiano | 437/100 |
| 4,627,990 | 12/1986 | Saga et al. | 118/612 |
| 4,664,944 | 5/1987 | Hsu et al. | 437/100 |

FOREIGN PATENT DOCUMENTS

| | | |
|---|---|---|
| 1467085 | 7/1964 | Fed. Rep. of Germany . |
| 3230727 | 2/1984 | Fed. Rep. of Germany . |
| 56-96883 | 8/1981 | Japan . |
| 5935099 | 8/1982 | Japan . |

OTHER PUBLICATIONS

Thermal Oxidation of 3C Silicon Carbide Single-Crystal Layers on Silicon; Fung et al.; Appl. Phys. Lett. 45(7), 10-1-84; pp. 757-759.

Metal-Oxide-Semiconductor Characteristics of Chemical Vapor Deposited Cubic-SiC; Shibahara et al.; Japanese Jrnl. of Appl. Physics; vol. 23, No. 11, 11-84, pp. L862-864.

C-V Characteristics of SiC Metal-Oxide-Semiconductor Diode with a Thermally Grown $SiO_2$ Layer; Suzuki et al.; Appl. Phys. Lett. vol. 39, No. 1; 7-1-81; pp. 89-90.

Thermal Oxidation of SiC and Electrical Properties of Al-$SiO_2$-SiC MOS Structure; Suzuki et al.; Jap. Jrnl. of Appl. Physics; vol. 21, No. 4, 4-82; pp. 579-585.

Behavior of Inversion Layers in 3C Silicon Carbide; Avila et al.; Appl. Phys. Lett. 49(6); 8-11-86; pp. 334-336.

General Principles of Growing Large-Size Single Crystals of Various Silicon Carbide Polytypes; Tairov et al.; Journal of Crystal Growth 52 (1981), pp. 146-150.

Solubility of Carbon in Silicon and Germanium; Scace et al.; Journal of Chemical Physics, vol. 60, No. 6, Jun. 1959, pp. 1551-1555.

Single Crystal Growth of SiC Substrate Material for Blue Light Emitting Diodes; Ziegler et al.; Transactions on Electron Devices; vol. ED-30, No. 4, Apr. 1983, pp. 277≧281.

Progress in Controlling the Growth of Polytypic Crystals; Tairov et al.; V. I. Ulyanov (Lenin) Electrical Eng. Institute, Leningrad, P-22, 197022 USSR; 8-24-82; pp. 111-161.

*Primary Examiner*—Brian E. Hearn
*Assistant Examiner*—William Bunch
*Attorney, Agent, or Firm*—Bell, Seltzer, Park

[57] ABSTRACT

The present invention is a method of forming large device quality single crystals of silicon carbide. The sublimation process is enhanced by maintaining a constant polytype composition in the source materials, selected size distribution in the source materials, by specific preparation of the growth surface of seed crystals, and by controlling the thermal gradient between the source materials and the seed crystal.

28 Claims, 3 Drawing Sheets

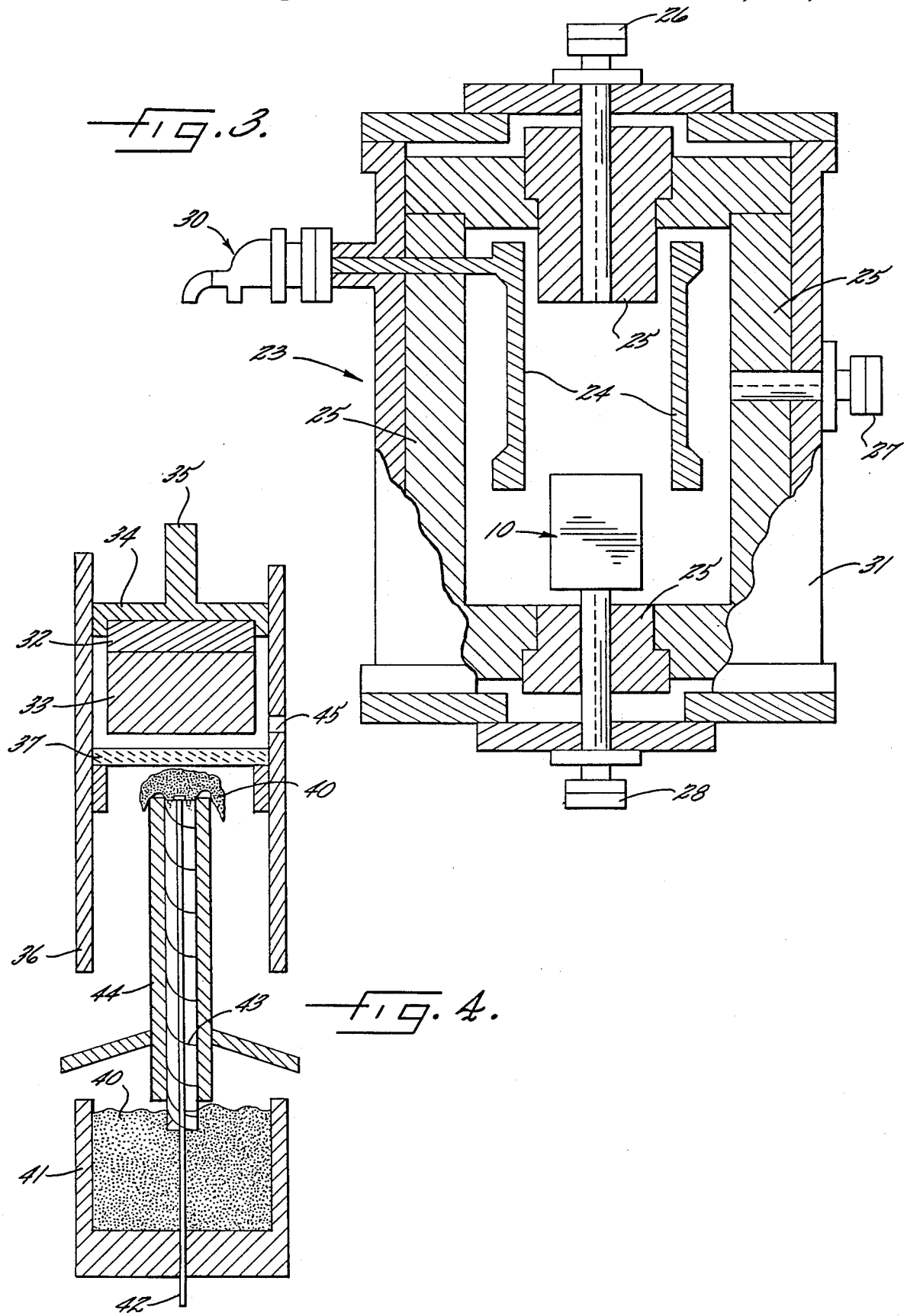

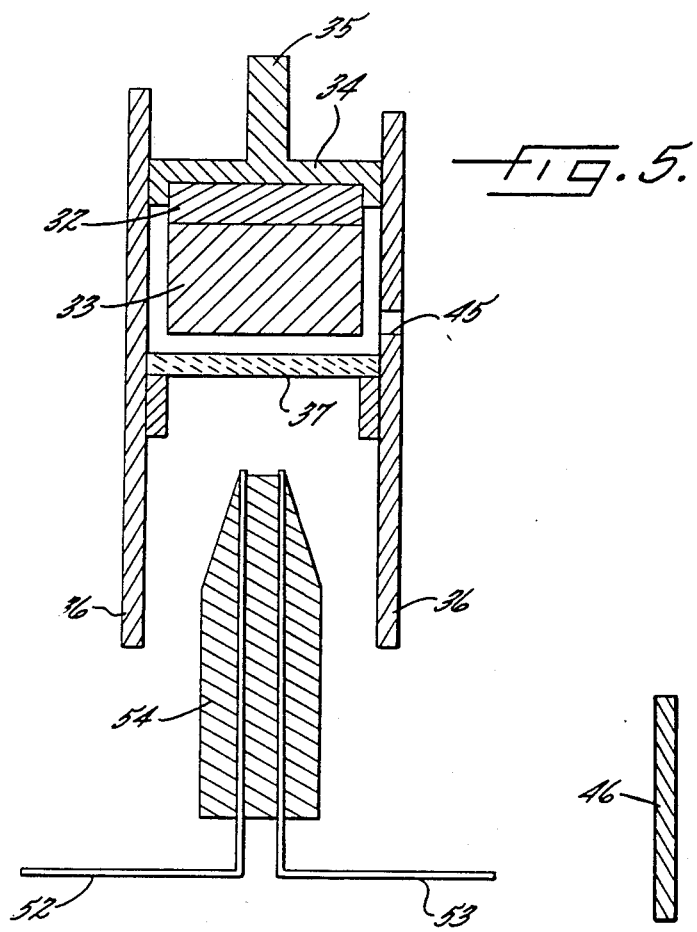
Fig. 5.
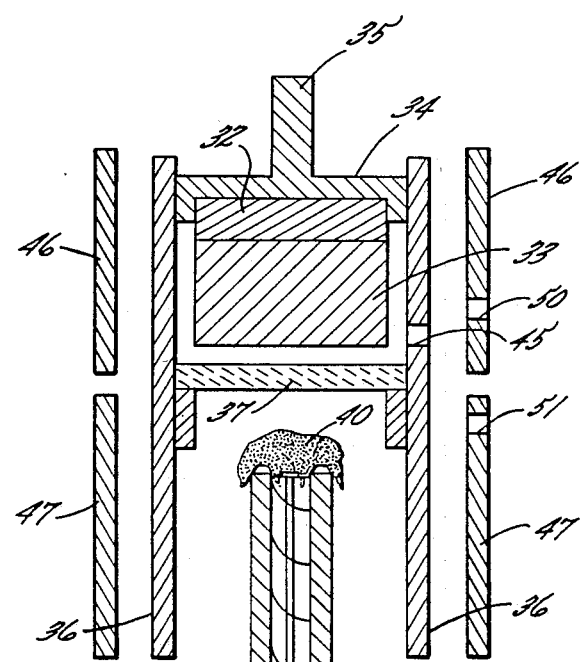
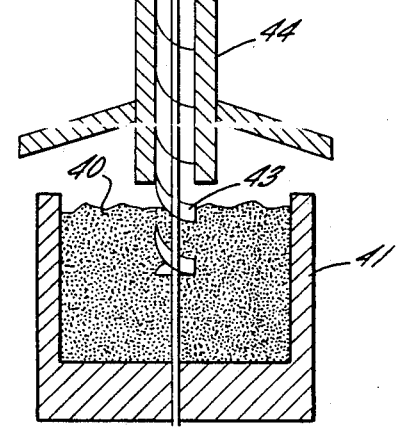
Fig. 6.

SUBLIMATION OF SILICON CARBIDE TO PRODUCE LARGE, DEVICE QUALITY SINGLE CRYSTALS OF SILICON CARBIDE

FIELD OF THE INVENTION

The present invention is a method for controlling the sublimation growth of silicon carbide to produce high quality single crystals.

BACKGROUND OF THE INVENTION

Silicon carbide is a perennial candidate for use as a semiconductor material. Silicon carbide has a wide bandgap (2.2 electron volts in the beta polytype, 2.8 in the 6H alpha), a high thermal coefficient, a low dielectric constant, and is stable at temperatures far higher than those at which other semiconductor materials such as silicon remain stable. These characteristics give silicon carbide excellent semiconducting properties, and electronic devices made from silicon carbide can be expected to perform at higher temperatures, and at higher radiation densities, than devices made from the presently most commonly used semiconductor materials such as silicon. Silicon carbide also has a high saturated electron drift velocity which raises the potential for devices which will perform at high speeds, at high power levels, and its high thermal conductivity permits high density device integration.

As is known to those familiar with solid state physics and the behavior of semiconductors, in order to be useful as a material from which useful electrical devices can be manufactured, the basic semiconductor material must have certain characteristics. In many applications, a single crystal is required, with very low levels of defects in the crystal lattice, along with very low levels of unwanted impurities. Even in a pure material, a defective lattice structure can prevent the material from being useful for electrical devices, and the impurities in any such crystal are preferably carefully controlled to give certain electrical characteristics. If the impurities cannot be controlled, the material is generally unsatisfactory for use in electrical devices.

Accordingly, the availability of an appropriate crystal sample of silicon carbide is a fundamental requirement for the successful manufacture of devices from silicon carbide which would have the desirable properties described above. Such a sample should be of a single desired crystal polytype (silicon carbide can form in at least 150 types of crystal lattices), must be of a sufficiently regular crystal structure of the desired polytype, and must be either substantially free of impurities, or must contain only those impurities selectively added to give the silicon carbide any desired n or p character.

Accordingly, and because the physical characteristics and potential uses for such silicon carbide have been recognized for some time, a number of researchers have suggested a number of techniques for forming crystalline silicon carbide.

These techniques generally fall into two broad categories, although it will be understood that some techniques are not necessarily so easily classified. The first technique is known as chemical vapor deposition ("CVD") in which reactant gases are introduced into some sort of system within which they form silicon carbide crystals upon an appropriate substrate. Novel and commercially significant improvements in such CVD techniques are discussed in currently co-pending applications which are assigned to the assignee of the present invention, "Growth of Beta-SiC Thin Films and Semiconductor Devices Fabricated Thereon," Ser. No. 113,921, filed Oct. 26, 1988; and "Homoepitaxial Growth of Alpha-SiC Thin Films and Semiconductor Devices Fabricated Thereon," Ser. No. 113,573, filed Oct. 26, 1988.

The other main technique for growing silicon carbide crystals is generally referred to as the sublimation technique. As the designation sublimation implies and describes, sublimation techniques generally use some type of solid silicon carbide material other than a desired single crystal of a particular polytype, as a starting material, and then heat the starting material until solid silicon carbide sublimes. The vaporized material is then encouraged to condense, with the condensation intended to produce the desired crystals.

As is known to those familiar with the physical chemistry of solids, liquids and gases, crystal growth is encouraged when the seed or surface upon which a crystal is being formed is at a somewhat lower temperature than the fluid, either gas or liquid, which carries the molecules or atoms to be condensed.

One technique for producing solid silicon carbide when crystal-type impurity is of little consideration is the Acheson furnace process, which is typically used to produce silicon carbide for abrasive purposes. One of the first sublimation techniques of any practical usefulness for producing better crystals, however, was developed in the 1950's by J. A. Lely, one technique of whom is described in U.S. Pat. No. 2,854,364. From a general standpoint, Lely's technique lines the interior of a carbon vessel with a silicon carbide source material. By heating the vessel to temperatures at which silicon carbide sublimes, and then allowing it to condense, recrystallized silicon carbide is encouraged to redeposit itself along the lining of the vessel. Although the Lely process can generally improve upon the quality of the source material, it has to date failed to produce on a consistent or repeatable basis, single crystals of silicon carbide suitable for electrical devices.

Hergenrother, U.S. Pat. No. 3,228,756, discusses another sublimation growth technique which utilizes a seed crystal of silicon carbide upon which other silicon carbide can condense to form the crystal growth. Hergenrother suggests that in order to promote proper growth, the seed crystal must be heated to an appropriate temperature, generally over 2000° centigrade, in such a manner that the time period during which the seed crystal is at temperatures between 1800° C. and 2000° C. is minimized.

Ozarow, U.S. Pat. No. 3,236,780, discusses another unseeded sublimation technique which utilizes a lining of silicon carbide within a carbon vessel, and which attempts to establish a radial temperature gradient between the silicon carbide-lined inner portion of the vessel and the outer portion of the vessel.

Knippenberg, U.S. Pat. Nos. 3,615,930 and 3,962,406, discuss alternative attempts at growing silicon carbide in a desired fashion. The '930 patent discusses a method of growing p-n junctions in silicon carbide as a crystal grows by sublimation. According to the discussion in this patent, silicon carbide is heated in an enclosed space in the presence of an inert gas containing a donor-type dopant atom, following which the dopant material is evacuated from the vessel and the vessel is reheated in the presence of an acceptor dopant. This technique is intended to result in adjacent crystal portions having opposite conductivity types and forming a p-n junction.

In the '406 patent, Knippenberg discusses a three-step process for forming silicon carbide in which a silicon dioxide core is packed entirely within a surrounding mass of either granular silicon carbide or materials which will form silicon carbide when heated. The system is heated to a temperature at which a silicon carbide shell forms around the silicon dioxide core, and then further heated to vaporize the silicon dioxide from within the silicon carbide shell. Finally, the system is heated even further to encourage additional silicon carbide to continue to grow within the silicon carbide shell.

Vodadkof, U.S. Pat. No. 4,147,572, discusses a geometry-oriented sublimation technique in which solid silicon carbide source material and seed crystals are arranged in parallel close proximity relationship to one another.

Addamiano, U.S. Pat. No. 4,556,436, discusses a Lely-type furnace system for forming thin films of beta silicon carbide on alpha silicon carbide which is characterized by a rapid cooling from sublimation temperatures of between 2300° centigrade and 2700° centigrade to another temperature of less than 1800° centigrade. Addamiano notes that large single crystals of cubic (beta) silicon carbide are simply not available and that growth of silicon carbide on other materials such as silicon or diamond is rather difficult.

Hsu, U.S. Pat. No. 4,664,944, discusses a fluidized bed technique for forming silicon carbide crystals which resembles a chemical vapor deposition technique in its use of non-silicon carbide reactants, but which includes silicon carbide particles in the fluidized bed, thus somewhat resembling a sublimation technique.

Some of the more important work in the silicon carbide sublimation techniques, however, is described in materials other than United States patents. For example, German (Federal Republic) Patent No. 3,230,727 to Siemens Corporation discusses a silicon carbide sublimation technique in which the emphasis of the discussion is the minimization of the thermal gradient between silicon carbide seed crystal and silicon carbide source material. This patent suggests limiting the thermal gradient to no more than 20° centigrade per centimeter of distance between source and seed in the reaction vessel. This patent also suggests that the overall vapor pressure in the sublimation system be kept in the range of between 1 and 5 millibar and preferably around 1.5 to 2.5 millibar.

This German technique, however, can be considered to be a refinement of techniques thoroughly studied in the Soviet Union, particularly by Y. M. Tairov; see e.g. *General Principles of Growing Large-Size Single Crystals of Various Silicon Carbide Polytypes*, J. Crystal Growth, 52 (1981) 46–150, and *Progress in Controlling the Growth of Polytypic Crystals*, from *Crystal Growth and Characterization of Polytype Structures*, edited by P. Krishna, Pergammon Press, London, 1983, p. 111. Tairov points out the disadvantages of the Lely method, particularly the high temperatures required for crystal growth (2600°–2700° C.) and the lack of control over the resulting crystal polytype. As discussed with reference to some of the other investigators in patent literature, Tairov suggests use of a seed as a method of improving the Lely process. In particular, Tairov suggests controlling the polytype growth of the silicon carbide crystal by selecting seed crystals of the desired polytype or by growing the recondensed crystals on silicon carbide faces worked at an angle to the 0001 face of the hexagonal lattice. Tairov suggests axial temperature gradients for growth of between approximately 30° and 40° centigrade per centimeter.

In other studies, Tairov investigated the effects of adjusting various parameters on the resulting growth of silicon carbide, while noting that particular conclusions are difficult to draw. Tairov studied the process temperatures and concluded that growth process temperature was of relatively smaller importance than had been considered by investigators such as Knippenberg. Tairov likewise was unable to draw a conclusion as to the effect of growth rate on the formation of particular polytypic crystals, concluding only that an increase in crystal growth rate statistically corresponds to an increase in the percentage of disordered structured crystals. Tairov was similarly unable to draw any conclusions between vapor phase stoichiometry and crystal growth, but pointed out that certain impurities will favor the growth of particular silicon carbide polytype crystals. For example, high nitrogen concentrations favor cubic polytype silicon carbide crystals, aluminum and some other materials favor the growth of hexagonal 4H polytype, and oxygen contributes to the 2H polytype. Tairov concluded that no understanding of the mechanisms leading to these effects had yet been demonstrated.

In Tairov's experiments, he also attempted using silicon carbide single crystals of particular polytypes as the vapor source material and suggested that using such single crystals of particular polytypes as vapor sources could result in particular polytypes of crystal growth. Of course, it will be understood that although the use of single crystals as source materials is theoretically interesting, a more practical goal, particularly from a commercial standpoint, is the production of single crystals from more common sources of silicon carbide other than single crystals.

Finally, Tairov concluded that the treatment of the substrate surface upon which sublimation growth was directed could affect the growth of the resulting crystals. Nevertheless, the wide variety of resulting data led Tairov to conclude that additional unidentified factors were affecting the growth he observed in silicon carbide crystals, and these unknown factors prevented him from reaching a fundamental understanding of the mechanisms of crystal growth.

Therefore, in spite of the long recognized characteristics of silicon carbide, and the recognition that silicon carbide could provide an outstanding, if not revolutionary, semiconductor material and resulting devices, and in spite of the thorough investigations carried out by a number of researchers including those mentioned herein, prior to the present invention there existed no suitable technique for repeatedly and consistently growing large single crystals of desired selected polytypes of silicon carbide.

Accordingly, it is an object of the present invention to provide a method for the controlled, repeatable growth of large single crystals of silicon carbide of desired polytypes.

It is a further object of the present invention to provide a method of growing large single crystals of silicon carbide by controlling the polytype of the source material.

It is another object of this invention to provide a method of growing such silicon carbide single crystals using source materials other than single crystals of silicon carbide.

It is a further object of this invention to provide a method of growing such silicon carbide crystals by selecting source materials having a particular surface area.

It is another object of this invention to provide a method of growing large silicon carbide single crystals by selecting source materials with predetermined particle size distributions.

It is a further object of this invention to provide a method of growing such silicon carbide single crystals using sublimation techniques and in which the thermal gradient between the source materials and the seed is continuously adjusted to maintain the most favorable conditions possible for continued growth of silicon carbide crystals over longer time periods and into larger crystals than have previously ever been accomplished.

The foregoing and other objects, advantages and features of the invention, and the manner in which the same are accomplished will become more readily apparent upon consideration of the following detailed description of the invention taken in conjunction with the accompanying drawings, which illustrate preferred and exemplary embodiments and wherein:

DESCRIPTION OF THE DRAWINGS

FIG. 3 is a cross-sectional diagram of a sublimation furnace used in accordance with the method of the present invention;

FIG. 4 is a diagram of a sublimation system illustrating a screw type mechanism for continuously introducing silicon carbide source powder into a system;

FIG. 5 is a diagram of a sublimation system showing a gas feed mechanism for introducing silicon carbide precursor materials into the sublimation system; and FIG. 6 is a diagram of a sublimation system illustrating independent heating elements used in accordance with the method of the present invention.

DETAILED DESCRIPTION

Figure 1:
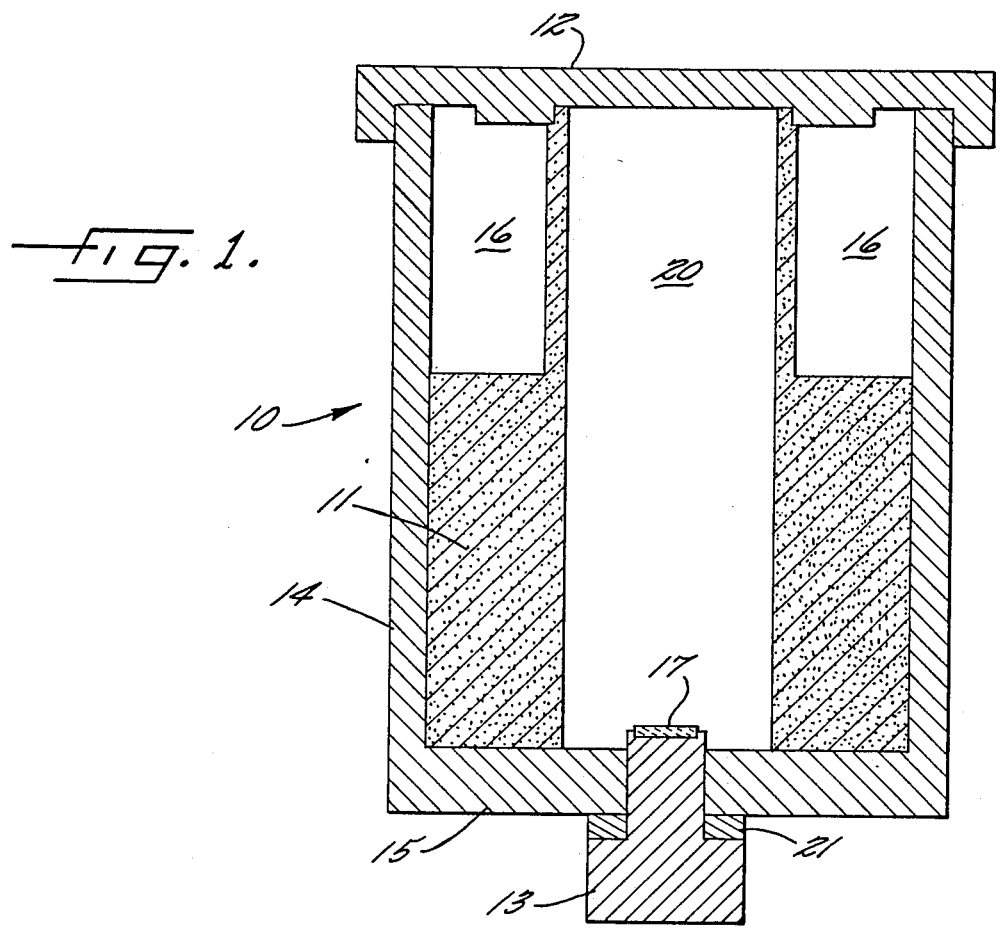
FIG. 1 is a cross-sectional diagram of a sublimation crucible used in accordance with the method of the present invention.
Figure 2:
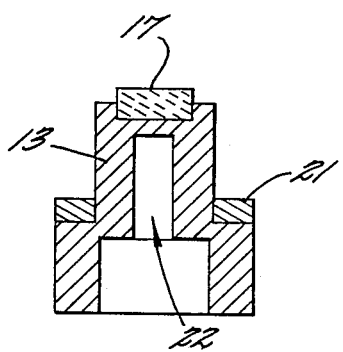
FIG. 2 is an enlarged view of the seed crystal holder of the crucible of FIG. 1.

FIG. 1 illustrates a cross-sectional view of a sublimation crucible used in accordance with the method of the present invention. The crucible is broadly designated at 10 and is typically formed of graphite. Crucible 10 is generally cylindrical in shape and includes a porous graphite liner 11, a lid 12, and a seed holder 13, an enlarged view of which is illustrated in FIG. 2. The remainder of the crucible is defined by the walls 14 and the floor 15. As further illustrated in FIG. 1, the porous graphite liner 11 is formed in such a manner as to provide an annular chamber 16 between lower portions of the porous graphite liner 11, the crucible walls 14 and the crucible lid 12. A central sublimation chamber is illustrated at 20.

In all of the apparatus described herein, the crucibles described are preferably formed of graphite and most preferably of a graphite which has approximately the same coefficient of thermal expansion as silicon carbide. Such materials are commercially available. The relative similarities of thermal coefficients of expansion are a particular requirement for materials which are being heated to the extremely high temperatures described herein and at which these processes take place. In this manner, the crucible can be prevented from cracking during the sublimation process and the lifetime of the crucible will generally be increased.

Furthermore, as is recognized by those familiar with attempts at growing silicon carbide crystals, the presence of graphite in the system encourages the growth of silicon carbide by providing an equilibrium source of carbon atoms as the sublimation process takes place and by dampening variations in the flux.

Furthermore, graphite is one of the few economically viable materials which can both withstand the high temperatures of these processes and avoid introducing undesired impurities into the vapor flux.

The seed holder 13 is illustrated in more detail in FIG. 2. A seed crystal 17 rests on upper portions of the seed holder 13 which extend into the chamber 20. A graphite washer 21 is positioned between the lower portions of the seed holder 13 and the floor of the crucible 15. FIG. 2 also shows an optical opening 22, which in preferred embodiments of the invention provides optical access to the seed so that the temperature of the seed can be monitored with an optical pyrometer.

A sublimation crucible such as illustrated in FIG. 1 is typically used in conjunction with a sublimation furnace broadly designated at 23 in FIG. 3, in which the crucible is again designated 10. Furnace 23 is generally cylindrical in shape and includes a cylindrical heating element 24, opposite portions of which are shown in the drawing. Furnace 23 is also surrounded by carbon fiber insulation 25 and includes optical ports 26, 27, and 28 through which optical pyrometers can measure the temperature of portions of the interior of the furnace. A power feed-through is generally designated at 30 and the outer housing of the furnace at 31.

In a first embodiment of the invention, a single seed crystal of silicon carbide having a desired polytype and silicon carbide source power are introduced into a system such as the sublimation crucible and furnace illustrated in FIGS. 1-3. Where the crucible is of the type illustrated in FIG. 1, the silicon carbide source powder is positioned in the annular chamber 16. In this first embodiment of the invention, it has been discovered that by utilizing silicon carbide source powder substantially all of which has a constant polytype composition, the production of a desired crystal growth upon the seed crystal can be greatly improved.

Although applicant does not wish to be bound by any particular theory, it is known that different polytypes of silicon carbide have different evaporation activation energies. Specifically, for cubic (3C) silicon carbide the evaporation activation energy is 108 kilocalories (kcal) per mole; for hexagonal 4H silicon carbide, 144 kcal/mole; and for hexagonal 6H silicon carbide, 119 kcal/mole. These differences are important, because when silicon carbide sublimes, it forms three basic vaporized materials: $Si$, $Si_2C$, and $SiC_2$. Depending upon the polytype of the source powder, the amount or "flux" of each of the species which is generated will differ. In a corresponding manner, the amount of each of the species in the overall vapor flux will tend to influence the type of polytypes which will grow when the species recondense.

As used herein, the term "flux" refers to the amount of matter or energy passing through a designated plane of a given area during a given period of time. Accordingly, when used to describe the flow of vaporized species, flux can be measured and designated in units of matter, area and time such as grams per square centimeter per second (g/cm$^2$/sec).

As used herein, the term "constant polytype composition" refers to a source powder or powders which are made up of a constant proportion of certain polytypes, including single polytypes. For example, a source powder which was formed substantially entirely of 6H alpha silicon carbide would exhibit a constant polytype composition, as would source powder that was 50 percent alpha polytype and 50 percent beta polytype. In other words, the composition—whether homogeneous or heterogeneous with respect to polytypes—must be controlled so as to remain the same throughout the sublimation process.

Stated more directly, if the source powder is selected and controlled so that substantially it has a constant polytype composition, the relative amounts or ratios of Si, Si$_2$C, and SiC$_2$ which are generated will remain constant and the other parameters of the process can be appropriately controlled to result in the desired single crystal growth upon the seed crystal. Alternatively, if the source powder is a variable mixture of various proportions of polytypes of silicon carbide, the relative amounts (ratios) of Si, Si$_2$C, and SiC$_2$ which are generated will continually vary and correspondingly continually encourage alternative polytypes to simultaneously grow upon the seed crystal. This results in growth upon the seed crystal of a number of crystals of different polytypes, an undesirable result.

Once the silicon carbide source powder and the seed crystal are introduced, the temperature of the silicon carbide source powder is raised to a temperature sufficient for silicon carbide to sublime from the source powder, typically a temperature on the order of 2300° C. While the temperature of the source powder is being raised, the temperature of the growth surface of the seed crystal is likewise raised to a temperature approaching the temperature of the source powder, but lower than the temperature of the source powder and lower than that at which silicon carbide will sublime. Typically, the growth surface of the seed crystal is heated to about 2200° C. By maintaining the silicon carbide source powder and the growth surface of the silicon carbide seed crystal at their respective temperatures for a sufficient time, macroscopic growth of monocrystalline silicon carbide of a desired polytype will form upon the seed crystal.

It will be understood by those familiar with phase changes that sublimation and condensation are equilibrium processes, and are affected by the vapor pressure of a system as well as absolute and relative temperatures. Accordingly, it will be further understood that in the processes and systems described herein, the vapor pressures are suitably controlled in a manner which permits these processes to proceed and be controlled and adjusted based upon the temperature and thermal gradient considerations described herein.

Further to the present invention, it has been discovered that in addition to maintaining a constant polytype composition, in order to form appropriate single crystals by the sublimation method, selecting silicon carbide source powder of a consistent particle size distribution similarly enhances the technique.

In a manner similar to that set forth earlier, the control of particle size in a consistent manner results in a consistent flux profile of the species which evolve from the silicon carbide source powder, with a corresponding consistency in the sublimation growth of silicon carbide upon the seed crystal. In one embodiment, a powder having the following particle size distribution enhanced the process, the distribution being defined by the weight percentage of a sample which will pass through a designated Tyler mesh screen:

| Tyler Mesh Screen | Weight Percent Passed |
|---|---|
| 20–40 | 43% |
| 40–60 | 19% |
| 60–100 | 17% |
| Over 100 | 21% |

Additionally, for a given powder morphology, the exposed surface area of the source powder is proportional to the particle size. A consistency in exposed surface area in turn enhances the overall consistency of the vapor flux, so that controlling the size distribution in this manner enhances the consistency of the flux profile.

As in the other embodiments discussed, the silicon carbide source powder and the growth face of the seed crystal are both heated to respective different temperatures, with the growth face of the seed crystal being somewhat cooler than the source powder so as to encourage condensation of the sublimed species from the source powder onto the seed crystal.

In another embodiment of the invention, it has been discovered that controlling the thermal gradient between the growth surface of the seed crystal and the source powder results in appropriate control and growth of large single crystals having a desired polytype. In this respect, the thermal gradient can be controlled in a number of ways. For example, under certain circumstances the thermal gradient is controlled so as to remain constant between the growth surface of the seed crystal while under other circumstances, controllably changing the thermal gradient between the source powder and the growth surface of the seed crystal is preferred.

As is known to those familiar with various sublimation techniques, a thermal gradient is often introduced by physically separating the source powder from the seed crystal while they are being maintained at their respective different temperatures. The resulting thermal gradient is thus a function of geometric separation between the source powder and the growth surface of the seed crystal; e.g. 20° C. per centimeter and the like. Thus, if the source powder is initially maintained at a temperature of, for example, 2300° C., and the growth surface of the seed crystal is maintained at a temperature of, for example, 2200° C. and a distance of 10 centimeters is initially maintained between the source powder and the seed crystal, a thermal gradient of 100° C. divided by 10 centimeters, i.e. 10° C. per centimeter, will be established.

In one embodiment of thermal gradient control, the invention comprises introducing the seed single crystal of silicon carbide of a desired polytype and a silicon carbide source powder into a sublimation system. The temperature of the silicon carbide source powder is raised to a temperature sufficient for the silicon carbide to sublime and a thermal gradient is introduced between the growth surface of the seed crystal and the source powder by elevating the temperature of the seed crystal to a temperature approaching the temperature of the source powder, but lower than the temperature of the source powder and lower than that at which silicon carbide will sublime, under the vapor pressure conditions of the system. As the crystal grows and the source powder generally nearest the top of the crucible is used up, the thermal gradient between the growth surface of the seed crystal and the source powder is increased to thereby continuously encourage further crystal growth beyond that which would be obtained by maintaining a constant thermal gradient.

During the sublimation growth process, gas species which contain silicon carbide evolve near the hotter top of the crucible and are transported via the thermal gradient to the seed at its respective lower temperature in the cooler lower portion of the crucible. The source material, however, is also in the thermal gradient and sublimation of the source material tends to occur at a much faster rate in the upper portion of the source material than in the lower portion. As a result if the temperature gradient remains constant, a rapid decrease in flux with time occurs as the upper source material is depleted. In a similar manner, as the crystal grows, its growth surface increases in temperature as a result of its change in position with respect to the thermal gradient. This causes a decrease in the sticking coefficient as a function of time and likewise reduces the growth rate.

According to the present invention, however, it has been discovered that if the thermal gradient is continually increased as the source powder is depleted and as the seed crystal grows, the absolute temperature difference between the source and seed can be maintained at an amount which continues to be most favorable for crystal growth.

In one embodiment of the invention, control of the thermal gradient comprises the step of increasing the thermal gradient between the growth surface of the seed crystal and the source powder, and the same is accomplished by increasing the temperature of the source powder while maintaining the temperature of the growth surface of the seed crystal at the initial lower temperature than the source powder.

In another embodiment, the invention comprises maintaining a constant thermal gradient as measured between the growth surface of the seed crystal and the source powder as the crystal grows and as the source powder is used up. It will be understood that the temperature of the growth surface is the most critical temperature with respect to the crystal as the growth surface is the surface at which thermodynamic conditions will either favor or disfavor continued desired growth of the crystal.

Accordingly, in another embodiment of the invention, the step of maintaining a fixed thermal gradient between the growth surface of the seed crystal and the source powder comprises providing relative movement between the growth surface of the seed crystal and the source powder as the seed crystal grows while maintaining the source powder and the growth face of the seed crystal at their respective different, but constant, temperatures.

In another embodiment, the step of maintaining a fixed thermal gradient between the growth surface of the seed crystal and the source powder comprises maintaining a fixed geometric distance between the growth surface of the seed crystal and the source powder as the crystal grows.

In yet another embodiment, the method of maintaining a constant thermal gradient between the growth surface of the seed crystal and the source powder can comprise independently controlling the source powder and seed crystal temperatures by separately monitoring the temperature of the source powder and the temperature of the seed crystal and separately adjusting the temperature of the source powder and the temperature of the seed crystal to maintain the desired thermal gradient.

In another embodiment of the invention, it has been discovered that growth of the single crystal of silicon carbide can be enhanced using the methods of the present invention by providing a silicon carbide seed crystal which presents a sublimation surface which is slightly off-axis with respect to one of the Miller index faces. In effect, off-axis silicon carbide crystals tend to transfer three dimensional crystalographic information to the condensing atoms during sublimation. Accordingly, such an off axis growth surface can be used to encourage the repeatable growth of a desired specific silicon carbide polytype. This technique is particularly important when a silicon carbide crystal is being doped with an impurity during sublimation growth. As is known to those familiar with the properties of silicon carbide, particular impurities tend to encourage the growth of specific polytypes of silicon carbide. For example, doping with aluminum is known to favor growth of 4H silicon carbide, but 6H crystals of silicon carbide can be grown with aluminum doping according to the present invention if an off-axis seed is used.

It has further been discovered according to the present invention that the thermal gradient control and indeed the entire process of controlling and maintaining temperatures can be enhanced by using resistance heating, rather than radio frequency (RF) induction heating in the method of the present invention.

Resistance heating offers a number of advantages in the overall sublimation process. First, resistance heating allows the process to be scaled up to larger crystal diameters than can be handled using induction heating. Induction heating techniques have several limitations which prevent any silicon carbide sublimation processes developed using induction techniques from being similarly scaled up to useful commercial scales. For example, in induction heating, the induction coil must be positioned outside of the vacuum vessel in which the sublimation takes place in order to prevent ionization of the gas (e.g. argon) present in the vessel. Secondly, if the diameter of the sublimation crucibles are increased, the coils used in the induction heating tend to heat only the outside layer of the crucible resulting in an undesirable and unacceptable radial thermal gradient. Finally, induction heating requires the use of a glass vacuum vessel to transmit the RF power. As a result, in order to prevent the glass vessel from overheating, either the thermal insulation present must be increased in thickness or the glass must be cooled, typically with water. Increasing the amount of thermal insulation reduces the practical size of the crystal that can be grown, and cooling the vessel with water dramatically reduces the energy efficiency of the entire system.

Alternatively, resistance heating is significantly more energy efficient than induction heating, resistance heating elements can be present within the vacuum vessel, skin heating or radial thermal gradient effects are almost entirely eliminated, and resistance heating permits improved temperature stability and repeatability of processes and control over the entire thermal gradient.

FIGS. 4, 5 and 6 illustrate some of the apparatus which can be used to accomplish the methods of the present invention. FIG. 4 shows a silicon carbide seed crystal 32 upon which a growing crystal 33 has epitaxially attached. The respective crystals 32 and 33 are maintained upon a graphite seed holder 34 which in turn is positioned upon a shaft 35. The remainder of the crucible is defined by graphite walls 36 and a porous graphite barrier 37. The silicon carbide source powder 40 is maintained in a bed 41. In order to ensure a constant supply of silicon carbide powder to a desired position, a rotating shaft 42 which carries a screw lifting mechanism 43 is positioned within a high density graphite cylinder 44. As illustrated in FIG. 4, as shaft 42 rotates, the screw mechanism 43 will lift silicon carbide source powder 40 to the top of the screw mechanism to a position adjacent the porous graphite barrier 37. As described earlier, in particular embodiments, the silicon carbide source powder at the top of the high density graphite cylinder 44 is maintained at a temperature of about 2300° C. while the temperature of the growth surface of the growing crystal 33 is maintained at a somewhat lower temperature, typically 2200° C.

Moving a continuous supply of silicon carbide source powder to the sublimation region offers several advantages. In particular, and as set forth with respect to the other techniques disclosed herein, the continuous supply further ensures that the subliming source powder generates a consistent flux density. In effect, new source powder is continuously moved into the sublimation area, providing a constant flux as sublimation proceeds.

An optical sight hole 45 is also illustrated, and can be used to either monitor the temperature of the growing crystal 33 using an optical pyrometer or to determine the exact position of the crystal with respect to the silicon carbide source powder 40 at the top of the high density graphite cylinder 44.

In certain embodiments of the invention, the shaft 35 can be pulled in a manner which moves the growth face of the growing crystal 33 away from, or if desired towards, the silicon carbide source powder 40.

In yet another embodiment of the invention, the shaft can be rotated to ensure that the temperature profile across the growth face is constant. In such a manner, the crystal can be encouraged to grow symmetrically as the effect of flux variations are dampened out and the growing crystal can be prevented from attaching itself to the graphite enclosure.

FIG. 6 illustrates a number of the same features as FIG. 4, but with the separate and independent heating elements illustrated. In FIG. 6, the separate and independently controlled resistance heating elements are shown at 46 and 47. As described earlier herein, the upper element 46 can be used to control the temperature of the seed crystal 32 and the growing crystal 33, while the lower heating element 47 can be used to control the temperature of the silicon carbide source powder 40 at the top of the high density graphite cylinder 44.

In order to monitor the respective temperatures generated by heating elements 46 and 47, optical sight holes 50 and 51 are provided to permit optical pyrometers to monitor the temperatures generated.

FIG. 5 illustrates an apparatus used to carry out yet another embodiment of the invention. In this embodiment, the silicon carbide which sublimes and then recondenses as the growing crystal, is not supplied as a powder, but instead is introduced into the system by providing respective gas feeds of silane ($SiH_4$) and ethylene ($C_2H_4$) into the system at a temperature at which they will immediately react to form silicon carbide vapors which will then migrate in the manner in which vapors generated from source powders will migrate through the porous graphite barrier and onto the growing crystal.

As in the earlier described embodiments, the system includes seed crystal 32, growing crystal 33, graphite seed holder 34, shaft 35, graphite walls 36, porous graphite barrier 37, and the optical sight hole 45. Instead of a bed of silicon carbide source powder, however, the system includes a silane gas feed 52 and an ethylene gas feed 53. In order to keep these molecules from dissociating under the high temperatures of the system, they are insulated in a water cooled molybdenum jacket until they reach a point in the sublimation system where the temperature is maintained at approximately 2400° C. and at which the materials are released and immediately react to form silicon carbide.

Once the silane and ethylene have left the jacket 54 and have reacted to form silicon carbide containing species, they behave in the same manner as would silicon carbide containing species which had sublimed from a source powder. They pass through the porous graphite barrier 37 and lodge upon the growth face of the growing crystal 33.

The use of such a gas feed system for sublimation purposes offers several advantages, the primary one being the delivery of a constant flux of SiC vapor to the growing crystal surface. Another advantage is the high purity in which silane and ethylene can be obtained in commercial quantities so that a resultingly pure crystal results from this technique.

EXAMPLE 1

A seed was prepared from a 6H alpha polytype silicon carbide. The seed crystal was lapped to insure flatness and then polished with progressively smaller sized diamond paste, finishing with a 0.1 micrometer paste. The seed was cleaned in hot sulfuric acid ($H_2SO_4$) for a period of five minutes, in a one-to-one mixture of ammonium hydroxide ($NH_4OH$) and hydrogen peroxide ($H_2O_2$) for five minutes, in hydrofluoric acid (HF) for one minute, and then finally rinsed in deionized water. The seed was oxidized in dry oxygen at 1200° C. for 90 minutes to remove residual polishing damage. The oxide was removed by etching with HF.

The seed and source powder were then loaded into the crucible. The source powder consisted of 6H silicon carbide grains having the following size distribution:

| Tyler Mesh Size | Percentage Passing Through (By Weight) |
| --- | --- |
| 20–40 | 43 percent |
| 40–60 | 19 percent |
| 60–100 | 17 percent |
| Over 100 | 21 percent |

The loaded crucible was then placed in the sublimation furnace while a slight overpressure of argon was maintained in the furnace to inhibit water contamination, and thus reducing the furnace pump down time. The furnace was evacuated to a base pressure below $5 \times 10^{-6}$ Torr. The furnace was heated in a vacuum ($5 \times 10^{-4}$ Torr) to 1200° C. for about ten minutes. It will be understood by those familiar with low pressure systems that an absolute vacuum can never be achieved. Therefore, the term "vacuum" as used herein refers to various systems which are at pressures less than atmospheric pressure, and where appropriate, specific pressures will be employed to best describe the particular conditions. The furnace was then backfilled with argon to a pressure of 400 Torr.

The temperature of the system was then increased until the top of the crucible is approximately 2260° C. and the temperature of the seed is approximately 2160° C., which in the particular system used corresponded to a thermal gradient of 31° C. per centimeter (cm). The system was then evacuated slowly over a period of 85 minutes from the pressure of 400 Torr to a pressure of about 10 Torr. The system was maintained under these conditions for six hours, after which the system was backfilled with argon to 760 Torr and the temperature reduced to 200° C. over a period of 90 minutes.

When the furnace was unloaded, the process had resulted in a transparent 6H alpha silicon carbide crystal 12 millimeters (mm) in diameter and 6mm thick.

EXAMPLE 2

A 6H Alpha-SiC seed was prepared by cutting the (0001) plane 3° towards the [1120] direction. The seed was then lapped to assure flatness, polished with progressively smaller diamond paste, cleaned, oxidized and etched, all as described in Example 1.

The source material was doped with aluminum in a quantity of 0.2 weight percent. The seed and source powder were loaded into the crucible, with the source powder having the same powder size distribution as set forth in Example 1. The crucible was loaded, the vessel evacuated, initially heated, and backfilled with argon, all as set forth in Example 1.

The temperature was then increased until the top of the crucible was 2240° C. and the seed was 2135° C., corresponding to a thermal gradient of 32° C./cm.

The furnace was evacuated from 400 Torr to 10 Torr as described in Example 1 and the sublimation conditions were maintained for a period of four hours. The furnace was then backfilled with argon to atmospheric pressure (760 Torr) and the temperature reduced to 200° C. over a period of 90 minutes.

When the furnace was unloaded, the process had resulted in a dark blue 6H Alpha-SiC crystal 12 mm in diameter and 6 mm thick. The resulting crystal was P type and had a carrier concentration of approximately $10^{18}$ carrier atoms per cubic centimeter.

In the description, there have been set forth preferred and exemplary embodiments of the invention which are set forth by way of example and not by way of limitation, the scope of the invention being set forth in the following claims.

That which is claimed is:

1. A method of reproducibly controlling the growth of large single crystals of a single polytype of silicon carbide independent of the use of impurities as a primary mechanism for controlling polytype growth, and which crystals are suitable for use in producing electrical devices, the method comprising:

introducing a monocrystalline seed crystal of silicon carbide of desired polytype and a silicon carbide source powder into a sublimation system;

raising the temperature of the silicon carbide source powder to a temperature sufficient for the source powder to sublime; while elevating the temperature of the growth surface of the seed crystal to a temperature approaching the temperature of the source powder, but lower than the temperature of the source powder and lower than that at which silicon carbide will sublime under the gas pressure conditions of the sublimation system; and generating and maintaining a substantially constant flow of vaporized Si, $Si_2C$, and $SiC_2$ per unit area per unit time from the source powder to the growth surface of the seed crystal for a time sufficient to produce a desired amount of macroscopic growth of monocrystalline silicon carbide of desired polytype upon the seed crystal.

2. A method according to claim 1 further comprising the step of preparing a polished seed crystal of silicon carbide prior to the step of introducing the seed crystal of silicon carbide into the closed system.

3. A method according to claim 1 wherein the step of introducing a seed single crystal of silicon carbide into a closed system containing silicon carbide source powder further comprises initially segregating the source powder and the seed crystal from one another.

4. A method according to claim 1 wherein the step of raising the temperature of the silicon carbide source powder comprises raising the temperature of the silicon carbide source powder to between about 2250° and 2350° centigrade.

5. A method according to claim 1 wherein the step of raising the temperature of the silicon carbide source powder comprises raising the temperature of the silicon carbide source powder to about 2300° centigrade.

6. A method according to claim 1 wherein the step of elevating the temperature of the seed crystal comprises elevating the temperature of the seed crystal to between about 2150° and 2250° centigrade.

7. A method according to claim 1 wherein the step of elevating the temperature of the seed crystal comprises elevating the temperature of the seed crystal to about 2200° centigrade.

8. A method according to claim 1 wherein the step of introducing a single seed crystal of silicon carbide comprises introducing a seed crystal for which a face corresponding to a low integer Miller index face has been cut to expose a face which is nonperpendicular to an axis normal to the low integer Miller index face which was cut.

9. A method according to claim 1 wherein the step of generating and maintaining a substantially constant flow of vaporized Si, $Si_2C$, and $SiC_2$ per unit area per unit time comprises introducing a source powder having a selected composition of polytypes and maintaining the selected composition of polytypes in the source powder substantially constant throughout the growth process.

10. A method according to claim 9 wherein the step of maintaining the originally selected composition of polytypes in the source powder comprises replenishing the source powder during the sublimation process using source powder replenishment having a composition of polytypes which will maintain the originally selected composition of polytypes in the source powder substantially constant in the sublimation system.

11. A method according to claim 1 wherein the step of generating and maintaining a substantially constant flow of vaporized Si, $Si_2C$, and $SiC_2$ per unit area per unit time comprises introducing a source powder having a selected predetermined distribution of surface areas and maintaining the selected distribution of surface areas in the source powder substantially constant throughout the growth process.

12. A method according to claim 11 wherein the step of maintaining the originally selected predetermined distribution of surface areas comprises replenishing the source powder during the sublimation process using source powder replenishment having a distribution of surface areas which will maintain the originally selected distribution of surface areas substantially constant in the source powder in the sublimation system.

13. A method according to claim 1 wherein the step of generating and maintaining a substantially constant flow of vaporized Si, $Si_2C$, and $SiC_2$ per unit area per unit time comprises introducing a source powder having a selected predetermined distribution of particle sizes and maintaining the selected distribution of particle sizes in the source powder substantially constant throughout the growth process.

14. A method according to claim 13 wherein the step of maintaining the originally selected predetermined distribution of particle sizes comprises replenishing the source powder during the sublimation process using source powder replenishment having a distribution of particle sizes which will maintain the originally selected distribution of particle sizes substantially constant in the source powder in the sublimation system.

15. A method according to claim 10, claim 12 or claim 14 wherein the step of replenishing the source powder during the sublimation process comprises feeding silicon carbide to the sublimation system using a screw conveying mechanism.

16. A method according to claim 10, claim 12 or claim 14 wherein the step of replenishing the source powder during the sublimation process comprises feeding silicon carbide to the sublimation system using ultrasonic energy to move silicon carbide powder into the system.

17. A method according to claim 15 wherein the step of increasing the temperature gradient between the seed crystal and the source powder comprises increasing the temperature of the source powder while maintaining the temperature of the growth surface of the seed crystal at the initial lower temperature than the source powder.

18. A method according to claim 15 wherein the step of introducing the thermal gradient comprises introducing a thermal gradient of 20° centigrade per centimeter.

19. A method according to claim 15 wherein the step of increasing the thermal gradient comprises increasing the thermal gradient from about 20° centigrade per centimeter to about 50° centigrade per centimeter.

20. A method according to claim 15 wherein the steps of raising the temperature of the source powder, introducing a thermal gradient and increasing the thermal gradient comprise using a resistance heating device to raise the temperature, introduce the thermal gradient and increase the thermal gradient.

21. A method according to claim 16 wherein the step of maintaining a fixed thermal gradient between the growth surface of the seed crystal and the source powder comprises providing relative movement between the growth surface of the seed crystal and the source powder as the seed crystal grows while maintaining the source powder at the temperature sufficient for silicon carbide to sublime and the seed crystal at the temperature approaching the temperature of the source powder but lower than the temperature of the source powder and lower than that at which silicon carbide will sublime.

22. A method according to claim 16 wherein the step of maintaining a fixed thermal gradient between the growth surface of the seed crystal and the source powder comprises maintaining a fixed distance between the growth surface of the seed crystal and the source powder as the crystal grows.

23. A method according to claim 16 wherein the step of maintaining a constant thermal gradient between the growth surface of the seed crystal and the source powder comprises independently controlling the source powder and seed crystal temperatures by separately monitoring the temperature of the source powder and the temperature of the seed crystal and separately adjusting the temperature of the source powder and the temperature of the seed crystal.

24. A method according to claim 14 wherein the step of replenishing the source powder during the sublimation process using source powder having a selected distribution of particle sizes comprises introducing silicon carbide powder having the following size distribution as determined by the weight percentage of a sample which will pass through a designated Tyler mesh screen:

| Tyler Mesh Screen | Weight Percentage Passed |
|---|---|
| 20–40 | 43% |
| 40–60 | 19% |
| 60–100 | 17% |
| Over 100 | 21% |

25. A method according to claim 1 wherein the step of generating and maintaining a substantially constant flow of vaporized Si, $Si_2C$, and $SiC_2$ per unit area per unit time from the source powder to the growth surface of the seed crystal comprises increasing the thermal gradient between the seed crystal and the source powder as the crystal grows and the source powder is used up to thereby maintain an absolute temperature difference between the source powder and seed crystal which continues to be most favorable for crystal growth and to continuously encourage further crystal growth beyond that which would be obtained by maintaining a constant temperature gradient.

26. A method according to claim 1 wherein the step of generating and maintaining a substantially constant flow of vaporized Si, $Si_2C$, and $SiC_2$ per unit area per unit time from the source powder to the growth surface of the seed crystal comprises maintaining a constant thermal gradient as measured between the growth surface of the seed crystal and the source powder as the crystal grows and as the source powder is used up while maintaining the growth surface of the seed crystal and the source powder at their respective different temperatures to thereby maintain a constant growth rate of the single seed crystal and a consistent growth of a single polytype upon the single growth surface of the seed crystal.

27. A method according to claim 1 including the step of rotating the seed crystal as the seed crystal grows and as the source powder is used up to thereby maintain a constant temperature profile across the growth surface of the seed crystal, to dampen the effect of flux variations, and to prevent the growing crystal from becoming attached to undesired mechanical portions of the closed system.

28. A method of reproducibly controlling the growth of large single crystals of a single polytype of silicon carbide independent of the use of impurities as a primary mechanism for controlling polytype growth, and which crystals are suitable for use in producing electrical devices, the method comprising:

introducing a monocrystalline seed crystal of silicon carbide of desired polytype and a silicon carbide source powder into a sublimation system, with the source powder having a selected composition of polytypes, a selected predetermined distribution of surface areas, and a selected predetermined distribution of particle sizes;

raising the temperature of the silicon carbide source powder to a temperature sufficient for the source powder to sublime; while elevating the temperature of the growth surface of the seed crystal to a temperature approaching the temperature of the source powder, but lower than the temperature of the source powder and lower than that at which silicon carbide will sublime under the gas pressure conditions of the sublimation system; and maintaining the selected composition of polytypes in the source powder substantially constant throughout the growth process; while maintaining the selected distribution of surface areas in the source powder substantially constant throughout the growth process; and while maintaining the selected distribution of particle sizes in the source powder substantially constant throughout the growth process, to thereby generate and maintain a substantially constant flow of vaporized Si, $Si_2C$, and $SiC_2$ per unit area per unit time from the source powder to the growth surface of the seed crystal, and all for a time sufficient to produce a desired amount of macroscopic growth of monocrystalline silicon carbide of desired polytype upon the seed crystal.

* * * * *

UNITED STATES PATENT AND TRADEMARK OFFICE
CERTIFICATE OF CORRECTION

PATENT NO.    : 4,866,005
DATED         : September 12, 1999
INVENTOR(S)   : Robert F. Davis, Calvin H. Carter, Jr. and Charles E. Hunter It is certified that error appears in the above-identified patent and that said Letters Patent is hereby corrected as shown below:

Column 1,
Line 4, the following statement should appear as the first paragraph:
-- The U.S. Government has a paid-up license in this invention and the right in limited circumstances to require the patent owner to license others on reasonable terms as provided for by the terms of contract N00014-82-K-0182 awarded by the Office of Naval Research. --

Signed and Sealed this

Fifteenth Day of March, 2005

JON W. DUDAS
*Director of the United States Patent and Trademark Office*